(12) United States Patent
Shirahige et al.

(10) Patent No.: US 9,147,784 B2
(45) Date of Patent: Sep. 29, 2015

(54) SEALING MATERIAL SHEET FOR SOLAR-CELL MODULE

(71) Applicant: Dai Nippon Printing Co., Ltd., Tokyo (JP)

(72) Inventors: Yasushi Shirahige, Tokyo (JP); Kosuke Saeki, Tokyo (JP); Hidenori Asai, Tokyo (JP); Toshio Yoshihara, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/388,587

(22) PCT Filed: Mar. 28, 2013

(86) PCT No.: PCT/JP2013/059414
§ 371 (c)(1),
(2) Date: Sep. 26, 2014

(87) PCT Pub. No.: WO2013/147102
PCT Pub. Date: Oct. 3, 2013

(65) Prior Publication Data
US 2015/0083207 A1    Mar. 26, 2015

(30) Foreign Application Priority Data

Mar. 29, 2012   (JP) .................................. 2012-075670

(51) Int. Cl.
*C08F 271/02*   (2006.01)
*C08F 4/28*   (2006.01)
(Continued)

(52) U.S. Cl.
CPC ............ *H01L 31/0481* (2013.01); *B29C 47/04* (2013.01); *B29C 47/14* (2013.01); C08J 5/18 (2013.01); *C08L 23/04* (2013.01); *C09J 4/06* (2013.01); *C09J 123/04* (2013.01);
(Continued)

(58) Field of Classification Search
CPC ............ B29C 47/14; C08L 23/04; C09J 4/06; C09J 123/04; H01L 31/0481; H01L 31/18; H29C 47/04; C08J 5/18; C08J 2323/36; C08K 5/1515; C08K 5/3424; Y02E 10/52
USPC ............... 526/317.1, 227, 352; 525/281, 410; 136/256; 264/477
See application file for complete search history.

(56) References Cited

U.S. PATENT DOCUMENTS

2012/0048354 A1    3/2012   Sato et al.

FOREIGN PATENT DOCUMENTS

JP    2000-091611    3/2000
JP    2009-010277    1/2009
(Continued)

OTHER PUBLICATIONS

International Search Report dated May 14, 2013 for PCT/JP2013/059414.

*Primary Examiner* — William Cheung
(74) *Attorney, Agent, or Firm* — Locke Lord LLP; Jeffrey D. Hsi

(57) ABSTRACT

The present invention provides a crosslinked polyethylene sealing material sheet for a solar-cell module offering exceptional heat resistance, wherein the sealing material sheet is provided with high metal-adhesion performance. A sealing material sheet for a solar-cell module comprises a sealing material sheet composition for a solar-cell module containing a polyethylene resin in a concentration of 0.900 g/cm3 or less, glycidyl methacrylate (GMA), a radical polymerization initiator, and triallyl isocyanurate (TAIC), wherein the GMA content of the sealing material sheet is 0.15 to 3.0% by mass, the TAIC content of the sealing material sheet is 0.15 to 3.0% by mass, and the radical polymerization initiator content of the sealer is 0.01 to 2.5% by mass.

17 Claims, 1 Drawing Sheet

(51) Int. Cl.

| | | |
|---|---|---|
| *C08F 20/06* | (2006.01) | |
| *C08F 110/02* | (2006.01) | |
| *H01L 31/00* | (2006.01) | |
| *B29C 35/08* | (2006.01) | |
| *H01L 31/048* | (2014.01) | |
| *B29C 47/14* | (2006.01) | |
| *C08L 23/04* | (2006.01) | |
| *C09J 4/06* | (2006.01) | |
| *C09J 123/04* | (2006.01) | |
| *B29C 47/04* | (2006.01) | |
| *C08J 5/18* | (2006.01) | |
| *H01L 31/18* | (2006.01) | |
| *C08K 5/1515* | (2006.01) | |
| *C08K 5/3492* | (2006.01) | |

(52) U.S. Cl.
CPC ............ *H01L 31/18* (2013.01); *C08J 2323/36* (2013.01); *C08K 5/1515* (2013.01); *C08K 5/34924* (2013.01); *Y02E 10/52* (2013.01)

(56) References Cited

FOREIGN PATENT DOCUMENTS

| | | | |
|---|---|---|---|
| JP | 2011077358 A | | 4/2011 |
| JP | 2011171338 A | | 9/2011 |
| JP | 2011-210798 A | | 10/2011 |
| JP | 2012054521 A | | 3/2012 |
| WO | WO 2008/014597 | * | 2/2008 |
| WO | WO-2010131716 A1 | | 11/2010 |

* cited by examiner

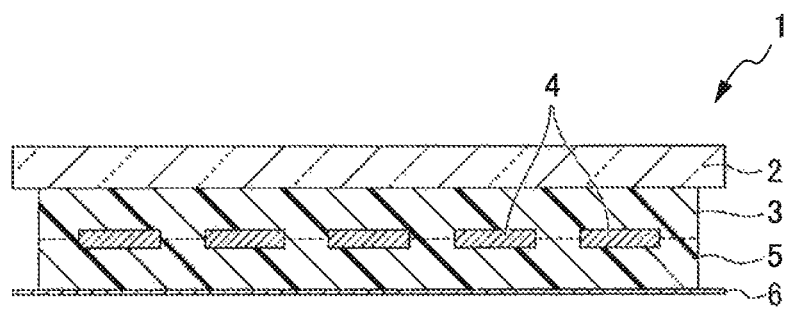

SEALING MATERIAL SHEET FOR SOLAR-CELL MODULE

CROSS-REFERENCE TO RELATED APPLICATIONS

This application is the national phase under 35 U.S.C. §371 of PCT International Application No. PCT/JP2013/059414, filed Mar. 28, 2013, which claims the benefit of Japanese Patent Application No. 2012-075670, filed Mar. 29, 2012, the entire contents of the aforementioned applications are hereby incorporated herein by reference.

TECHNICAL FIELD

The present invention relates to a sealing material sheet for a solar-cell module, a sealing material sheet for a solar-cell module, and a solar-cell module using the same. More particularly, the present invention relates to a sealing material sheet and a sealing material sheet for a solar-cell module using glycidyl methacrylate (GMA) as an adhesion-improving agent, and a solar-cell module using the same.

BACKGROUND ART

Recently, as awareness of the environmental problems rises to a higher level, solar cells are in the spotlight as clean energy resources. Currently, solar-cell modules that are constituted in various types are developed and suggested. In general, a solar-cell module is constituted by laminating a transparent front substrate, a solar cell element, and a rear-surface protecting sheet through a sealing material sheet.

Ethylene-vinyl acetate copolymer resin (EVA) has been the most commonly used material as the sealing material sheet used for protecting a solar cell element filled in a solar-cell module from outside impact, and also for preventing the invasion of water into the solar-cell module. However, EVA resin tends to slowly decompose as it is used for a long period of time, and thus, deteriorates in the solar-cell module, thereby having the possibility of decreasing strength or generating acetic acid gas affecting the solar cell element. In order to solve such a problem, a sealing material sheet for a solar-cell module, which is formed by using a polyethylene-based resin instead of an EVA resin, has been suggested (see Patent Document 1).

In addition, for example, a sealing material sheet formed by a modified ethylene-based resin including alkoxysilane as a co-polymerization component is known as a polyethylene-based sealing material sheet. In addition, a sealing material sheet crosslinked by a modulation process or a subsequent heating process after combining such a modified ethylene-based resin with a crosslinking agent is known (see Patent Document 2). Such a polyethylene-based sealing material sheet has weatherability and durability that are equivalent to or more than that of a sealing material sheet of an EVA resin, and thus, may be preferably used as a sealing material sheet for a solar-cell module.

Meanwhile, a sealing material sheet for a solar-cell module requires high adhesion to other members that are laminated above and below in a solar-cell module. However, for the above-described polyethylene-based sealing material sheet, there is room for further improvement in consideration of adhesion to electrodes of a solar cell element constituted of zinc oxide, and the like, especially. As the thing that can solve such a problem, a sealing material sheet for a solar-cell module, which is formed by using the resin added with an ethylene copolymer including glycidyl methacrylate (GMA) as an adhesion improving agent, has been suggested (see Patent Document 3).

Patent Document 1: Japanese Unexamined Patent Application, Publication No. 2000-91611
Patent Document 2: Japanese Unexamined Patent Application, Publication No. 2009-10277
Patent Document 3: Japanese Unexamined Patent Application, Publication No. 2011-77358

DISCLOSURE OF THE INVENTION

Problems to be Solved by the Invention

However, GMA contributes to the improvement of metal adhesion, but is very likely to react with a radical polymerization initiator and strongly tends to hinder the progression of the crosslinking that is required in a process for preparing a sealer. Therefore, as disclosed in Patent Document 3, when GMA is added to a sealing material sheet requiring a crosslinking treatment, there is a problem in that heat resistance by the crosslinking treatment is insufficiently improved.

The present invention achieved in consideration of such a situation, and an object of the present invention is to provide a polyethylene-based sealing material sheet having excellent heat resistance, which is subjected to a crosslinking treatment, and also a sealing material sheet for a solar-cell module, which has high metal adhesion.

Means for Solving the Problems

The inventors of the present invention conducted a thorough investigation with regard to the problems described above, and as a result, the inventors found that by using the composition constituted by adding GMA and triallyl isocyanurate (TAIC) to a low-density polyethylene-based resin, it is possible to prepare a sealing material sheet for a solar-cell module having sufficiently high metal adhesion while having heat resistance that is required for a sealing material sheet for a solar-cell module. Thus, the inventors finally completed the present invention. More specifically, the present invention provides the following.

(1) A sealing material sheet for a solar-cell module, the sealing material sheet including a polyethylene-based resin with a density of 0.900 g/cm$^3$ or less, glycidyl methacrylate, a radical polymerization initiator, and triallyl isocyanurate, in which the content of the glycidyl methacrylate in the sealing material sheet is 0.15% by mass to 3.0% by mass, the content of the triallyl isocyanurate in the sealing material sheet is 0.15% by mass to 3.0% by mass, and the content of the radical polymerization initiator in the sealing material sheet is 0.01% by mass to 2.5% by mass.

(2) The sealing material sheet for a solar-cell module described in the above (1), in which the content of the radical polymerization initiator in the sealing material sheet is 0.01% by mass to 0.5% by mass.

(3) The sealing material sheet for a solar-cell module described in the above (1) or (2), in which the polyethylene-based resin is metallocene-based linear low-density polyethylene.

(4) The sealing material sheet for a solar-cell module described in any one of the above (1) to (3), in which the polyethylene-based resin includes a silane copolymer constituted by copolymerizing at least α-olefin and an ethylenically unsaturated silane compound in a comonomer.

(5) A sealing material sheet for a solar-cell module, the sealing material sheet being a sealing material sheet for a solar-cell module in a mono-layer or co-extruded multi-layers including an adhesion-reinforcing layer, in which the adhesion-reinforcing layer is constituted of the sealing material sheet described in any one of the above (1) to (4), when the sealing material sheet is in the mono-layer, the sealing material sheet in the mono-layer is constituted of the adhesion-reinforcing layer, and when the sealing material sheet is in the co-extruded multi-layers, the adhesion-reinforcing layer is arranged on the outermost layer of at least any one side.

(6) A method for preparing a sealing material sheet for a solar-cell module, the method including a process for melting and molding the sealing material sheet described in any one of the above (1) to (4), in which the glycidyl methacrylate is mixed with the polyethylene-based resin in a state of a simple substance being isolated from other components, and thus, the sealing material sheet is adjusted.

(7) A method for preparing a sealing material sheet for a solar-cell module, the method including an ionizing radiation crosslinking process for obtaining a sealing material sheet after being crosslinked by irradiating the ionizing radiation by performing the further crosslinking treatment through the irradiation of an ionizing radiation to the sealing material sheet described in the above (5).

(8) A solar-cell module including the sealing material sheet described in the above (5), and a solar cell element having metal electrodes, in which the sealing material sheet and the solar cell element are adhered and laminated.

Effects of the Invention

According to the present invention, a sealing material sheet for a solar-cell module having preferred heat resistance that is required for a sealing material sheet for a solar-cell module and also having the adhesion to a metal can be provided.

BRIEF DESCRIPTION OF THE DRAWINGS

FIG. 1 is a cross-sectional view schematically illustrating an example of the layer constitution of the solar-cell module according to an embodiment of the present invention.

EXPLANATION OF REFERENCE NUMERALS

1 Solar-cell module
2 Transparent front substrate
3 Front sealer layer
4 Solar cell element
5 Back-surface sealer layer
6 Rear-surface protecting sheet

PREFERRED MODE FOR CARRYING OUT THE INVENTION

Hereinafter, the embodiments of the present invention will be described in detail, but the present invention is not limited to the following embodiments. The present invention may be properly modified and performed within the range of the purposes thereof.

Summary of Sealing Material Sheet and Solar-Cell Module Using the Same

First, referring to FIG. 1, the whole constitution of the solar-cell module using the sealing material sheet of the present invention will be simply described using the solar-cell module 1 that is an embodiment of the present invention as an example.

The solar-cell module 1 is constituted by laminating, from the side of the lighting surface thereof, a glass substrate 2, a front sealer layer 3, a solar cell element 4, a back-surface sealer layer 5, a rear-surface protecting sheet 6 in order. The sealer layer constituted of the front sealer layer 3 and the back-surface sealer layer 5 (hereinafter, both of them are also referred to as a "sealer layer" together) comes in contact with the glass substrate 2, the solar cell element 4, and the rear-surface protecting sheet 6, respectively, in the solar-cell module 1. Therefore, the sealing material sheet constituting the sealer layer requires high adhesion to a metal or the like in addition to glass adhesion.

The sealing material sheet of the present invention uses low-density polyethylene as a base resin, on the assumption that the crosslinking treatment by heating is performed in the follow-up processes until being integrated into the solar-cell module 1. In addition, for the purpose of improving metal adhesion to the base resin, glycidyl methacrylate (GMA) is added as an adhesion-improving agent, and also triallyl isocyanurate (TAIC) is added as a crosslinking assistant. According to the above-described unique composition, the sealing material sheet of the present invention having improved heat resistance and metal adhesion can be more preferably used as a sealer layer of the solar-cell module 1.

Hereinafter, the sealing material sheet for a solar-cell module according to the present invention (hereinafter, also simply referred to as "sealing material sheet"), the sealing material sheet for a solar-cell module (hereinafter, also simply referred to as "sealing material sheet"), and a solar-cell module will be described in detail in order.

Sealing Material Sheet for Solar-Cell Module

The sealing material sheet includes a polyethylene-based resin with a density of 0.900 $g/cm^3$ or less, glycidyl methacrylate (GMA), a radical polymerization initiator, and triallyl isocyanurate (TAIC) as a necessary component. Next, the necessary components will be described, and then other resins and other components will be described.

[Low-Density Polyethylene]

In the present invention, low-density polyethylene (LDPE), preferably linear low-density polyethylene (LLDPE) with a density of 0.900 $g/cm^3$ or less is used. The linear low-density polyethylene is a copolymer of ethylene and α-olefin, and in the present invention, the density thereof is within the range of 0.900 $g/cm^3$ or less, and more preferably, in the range of from 0.870 $g/cm^3$ to 0.890 $g/cm^3$. Within the above range, the adhesion between the sealing material sheet and glass or a metal is increased.

In the present invention, it is preferable to use metallocene-based linear low-density polyethylene. The metallocene-based linear low-density polyethylene is synthesized by using a metallocene catalyst that is a single site catalyst. The above-described linear low-density polyethylene has little side-chain branching, and uniform comonomer distribution. Therefore, the metallocene-based linear low-density polyethylene has narrow molecular weight distribution, is capable of having the above-described ultra-low-density, and also can impart flexibility to the sealing material sheet. As a result of imparting flexibility to the sealing material sheet, the adhesion between the sealing material sheet and glass or a metal is increased.

In addition, the linear low-density polyethylene has narrow crystalline distribution and uniform crystal size, and thus, there is no polyethylene having a large crystal size and also the crystallinity itself is low due to being low-density. Therefore, the linear low-density polyethylene has excellent transparency when being processed in sheet form. Therefore, even when the sealing material sheet constituted of the sealing material sheet of the present invention is arranged between the transparent front substrate and solar cell element, the power generation efficiency is almost not reduced.

As α-olefin of the linear low-density polyethylene, it is preferable to use α-olefin without branches. Among them, it is particularly preferable to use 1-hexene, 1-heptene, or 1-octene that is α-olefin having 6 to 8 carbon atoms. When α-olefin of the linear low-density polyethylene has 6 to 8 carbon atoms, favorable flexibility can be imparted to the sealer for a solar-cell module. In addition, from this, favorable strength can be imparted to the sealing material sheet for a solar-cell module. As a result, the adhesion between the sealing material sheet for a solar-cell module and a transparent front substrate such as glass is further increased, and thus, the invasion of water can be inhibited.

As the melt mass flow rate (MFR) of low-density polyethylene, MFR at 190° C. and a load of 2.16 kg, which is measured by JIS-K6922-2, (in the present specification, hereinafter, the value measured by the measuring conditions is referred to as "MFR") is preferably 0.5 g/10 min to 40 g/10 min, and more preferably, 2.5 g/10 min to 40 g/10 min. By the MFR of low-density polyethylene being from 0.5 g/10 min to 40 g/10 min, the sealing material sheet can have excellent adhesion to other members of the solar-cell module constituted of glass, a metal, or the like with other members.

The content of the low-density polyethylene with a density of 0.900 g/cm$^3$ or less, which is included in the sealing material sheet, is preferably 10% by mass to 99% by mass, more preferably 50% by mass to 99% by mass, and most preferably 90% by mass to 99% by mass with respect to the whole resin components in the sealing material sheet. If the melting point of the sealing material sheet is in the range of less than 80° C., other resins may be included. They may be used, for example, as a resin for addition, or may be used to make other components to be described below a master batch.

[Adhesion Improving Agent: Glycidyl Methacrylate (GMA)]

Glycidyl methacrylate (GMA) is used in the sealing material sheet of the present invention as an adhesion-improving agent for improving metal adhesion. Here, a silane coupling agent having a glycidyl group may be used as the adhesion-improving agent for improving metal adhesion. However, there are problems in that it is difficult for the silane coupling agent having a glycidyl group to bind with a base resin main chain, and it is hard for the silane coupling agent having a glycidyl group to exhibit durability. In that point, GMA has a methacrylic group not like the silane coupling agent having a glycidyl group, and thus, can be directly bound to a base resin main chain. Therefore, the GMA can impart more preferred adhesion, and particularly, more preferred durable adhesion to the sealing material sheet.

The sealing material sheet prepared by adding the polymer including GMA to EVA or the like as an adhesion component is conventionally known. However, the glycidyl group of the GMA has high reactivity with a metal surface. Therefore, even when the GMA in the state of an isolated simple substance, which is not polymerized with other components, is added to the sealing material sheet and then mixed, the GMA greatly contributes to the improvement of the metal adhesion of the sealing material sheet. According to the sealing material sheet of the present invention, the metal adhesion of the sealing material sheet may be improved by adding the GMA in a simple substance. Therefore, according to the sealing material sheet of the present invention, the process for polymerizing the GMA with a resin component in advance can be omitted, and thus, the production efficiency of the sealing material sheet can be improved by the simplification of the process.

Meanwhile, the GMA has high reactivity with a radical, and thus, is reacted with a crosslinking agent (a radical polymerization initiator). Therefore, the GMA strongly tends to hinder the progression of crosslinking. In the sealing material sheet of the present invention, low-density polyethylene is applied as a base resin in order to solve such a problem, a suitable amount of a radical polymerization initiator is added thereto, and also, GMA as an adhesion-improving agent and triallyl isocyanurate (TAIC) as a crosslinking assistant are used together in a predetermined combination ratio. According to such a specific composition, for the sealing material sheet, the crosslinking at the time of an extrusion molding is appropriately carried out, the heat resistance thereof is increased, and also the metal adhesion thereof is sufficiently increased.

The content of the GMA in the sealing material sheet may be 0.15% by mass to 3.0% by mass, and preferably 0.2% by mass to 0.5% by mass. When the content of the GMA in the sealing material sheet is less than 0.15% by mass, the improvement in efficiency of metal adhesion is not sufficiently exhibited. In addition, when the content of the GMA exceeds 3.0% by mass, the heat resistance is insufficient due to excessive crosslinking inhibition and bleed out of the GMA, and thus, it is not preferable. By using the sealing material sheet having the content of the GMA in the above-described range, the sealing material sheet having more preferred metal adhesion can be obtained.

[Crosslinking Assistant: Triallyl Isocyanurate (TAIC)]

In the present invention, TAIC is added as a crosslinking assistant in order to prevent the inhibition of crosslinking progression by GMA. TAIC is sufficiently added to properly promote the crosslinking, and thus, the heat resistance of the sealing material sheet can be increased. In addition, by adjusting the added amount of TAIC, the degree of the crosslinking is weakened, and thereby, the state of increased molecular weight (hereinafter, also referred to as so-called "weak crosslinking") may be newly formed, and also, while maintaining film-formation ability by heating during the molding, such a weak crosslinking reaction may be carried out. By performing such a weak crosslinking treatment, the transparency and durability of the sealing material sheet for a solar-cell module can be sufficiently improved.

By promoting the crosslinking after molding the sealing material sheet with TAIC, which is a trifunctional monomer, the heat resistance of the sealing material sheet can be sufficiently improved. Such a functional group may generate radical active species by the irradiation of energy, such as light or heat. The radical active species generated by the functional group may be grafting-reacted with the polyethylene-based resin, which is a base resin, and may crosslink the polyethylene-based resin. The functional monomer has at least two or three functional groups, such as an arylate group, a methacrylate group, an aryl group, in the monomer, and thus, a plurality of radical active species may be generated, and the radical active species may crosslink various polyethylene-based resins. As a result, the molecular weight of the polyethylene-based resin, which is a base resin, can be increased.

The content of TAIC is 0.15% by mass to 3.0% by mass, and preferably 0.2% by mass to 1.5% by mass in the sealing material sheet for a solar-cell module. When it is 0.15% by mass or more, the crosslinking reaction with the polyethylene-based resin is necessarily and sufficiently exhibited, and thereby, the heat resistance at a high temperature can be imparted, and thus, it is preferable. When it is 3.0% by mass or less, a weak crosslinking reaction is appropriately carried out, and thereby, favorable film formation ability can be imparted to the sealing material sheet even at a low temperature.

[Radical Polymerization Initiator (Crosslinking Agent)]

The sealing material sheet of the present invention includes a known radical polymerization initiator as a crosslinking agent. Examples of the radical polymerization initiator may include organic peroxides, for example, hydroperoxides such as diisopropylbenzene hydroperoxide, and 2,5-dimethyl-2,5-di(hydroperoxy)hexane; dialkyl peroxides, such as di-t-butyl peroxide, t-butyl cumyl peroxide, dicumyl peroxide, 2,5-dimethyl-2,5-di(t-butylperoxy)hexane, and 2,5-dimethyl-2,5-di(t-peroxy)hexyne-3; diacyl peroxides, such as bis-3,5,5-trimethylhexanoyl peroxide, octanoyl peroxide, benzoyl peroxide, o-methylbenzoyl peroxide, and 2,4-dichlorobenzoyl peroxide; peroxy esters, such as t-butyl peroxyacetate, t-butyl peroxy-2-ethyl hexanoate, t-butyl peroxy pivalate, t-butyl peroxy octoate, t-butyl peroxy isopropylcarbonate, t-butyl peroxy benzoate, di-t-butyl peroxy phthalate, 2,5-dimethyl-2,5-di(benzoyl peroxy)hexane, 2,5-dimethyl-2,5-di(benzoyl peroxy)hexane-3, and t-butyl peroxy-2-ethylhexyl carbonate; ketone peroxides such as methyl ethyl ketone peroxide, and cyclohexanone peroxide, and the like, or azo compounds such as azobisisobutyronitrile, and azobis(2,4-dimethylvaleronitrile), silanol condensation catalysts such as dibutyl tin diacetate, dibutyl tin dilaurate, dibutyl tin dioctate, dioctyl tin dilaurate, and dicumyl peroxide, and the like.

The content of the radical polymerization initiator is in the range of 0.01% by mass to 2.5% by mass, preferably 0.015% by mass to 1.0% by mass, and more preferably 0.02% by mass to 0.5% by mass in the sealing material sheet for a solar-cell module. When it is less than 0.01%, even though TAIC is added, the radical is quenched in GMA, and thus, the crosslinking of the polyethylene-based resin is not carried out up to the necessary degree, and the heat resistance is insufficient for the sealing material sheet. In addition, when it exceeds 2.5%, gel is generated during the molding, and thus, the film formation ability is reduced, and also the transparency is reduced.

Here, as a preferred example of a method for preparing low-density polyethylene-based resin, there is a preparing method in that by adding a polymerization initiator in a small amount as compared with the case of conventional general crosslinking treatment, a weak degree of crosslinking (weak crosslinking) is carried out, and thus, the state of increased molecular weight is exhibited. In addition, while maintaining film formation ability by heating during the molding, the weak crosslinking reaction is carried out, and thus, the polyethylene-based sealing material sheet having well-balanced flexibility, heat resistance, transparency, and adhesion can be obtained. In this case, the content of the radical polymerization initiator in the sealing material sheet is 0.02% by mass to 0.5% by mass, but even in the process requiring the delicate adjustment for the crosslinking progression, the sealing material sheet of the present invention may be extremely preferably used.

In addition, in the case of performing the weak crosslinking treatment as described above, especially, t-butyl peroxy 2-ethylhexyl carbonate, 2,5-dimethyl-2,5-di(t-butyl peroxy) hexane, and the like among the above-described polymerization initiators may be preferably used. They have a high amount of active oxygen, that is, 5% or more, and also, the half-life temperatures of the polymerization initiators are 160 to 190° C. during one minute, and thereby, they are consumed at the time of molding and remain after the molding to inhibit the unnecessary progression of post-crosslinking. Therefore, they are preferable. In this case, when the half-life temperature during one minute is less than 160° C., it is difficult to carry out the crosslinking reaction after the polymerization initiator is sufficiently dispersed during the molding, and thus, it is not preferable.

As described above, for the sealing material sheet of the present invention, low-density polyethylene is used as a base resin, and all the contents of the three components such as GMA, TAIC, and a radical polymerization initiator are adjusted in an optimal range. Therefore, both heat resistance and metal adhesion are sufficiently improved, both of which are difficult to achieve in the conventional polyethylene-based sealing material sheet.

[Other Adhesion Improving Agents: Silane Coupling Agent]

In addition known silane coupling agents may be also used together as other adhesion improving agents. Examples of the silane coupling agent may preferably include, although not particularly limited thereto, vinyl-based silane coupling agents, such as vinyltrichlorosilane, vinyltrimethoxysilane, and vinyltriethoxysilane, methacryloxy-based silane coupling agents, such as 3-methacryloxy propyltrimethoxysilane, 3-methacryloxypropyldiethoxysilane, and 3-methacryloxypropyltriethoxysilane, and the like. In addition, they may be used singly or in a combination of two or more of them. Among them, the methacryloxy-based silane coupling agents may be particularly preferably used.

In the case of adding a silane coupling agent as an adhesion improving agent, the content thereof is 0.1% by mass to 10.0% by mass and the upper limit thereof is preferably 5.0% by mass or less, with respect to all the components in the sealing material sheet. When the content of the silane coupling agent is in the above range and also the predetermined amounts of the radical polymerization initiator and TAIC are included in the polyethylene-based resin constituting the sealing material sheet, the adhesion is improved to be in the more preferred range. In addition, when it exceeds the above range, there are cases in that the film formation ability is reduced, and also so-called bleed out, in which the silane coupling agent is agglomerated and solidified as time passes, and then, becomes powder on the surface of the sealing material sheet, may be generated, and thereby, it is not preferable.

[Radical Absorbent]

For the sealing material sheet of the present invention, by using both of the crosslinking agents described above, that is the radical polymerization initiator and a radical absorbent that quenches the radical polymerization initiator, the degree of crosslinking may be adjusted. Examples of the radical absorbent may include a hindered phenol-based antioxidant and a hindered amine-based weathering stabilization. The hindered phenol-based radical absorbent having high radical adsorption ability near the crosslinking temperature is preferable. The used amount of the radical absorbent is preferably 0.01% by mass to 3% by mass, and more preferably in the range of 0.05% by mass to 2.0% by mass in the composition. When it is within the range of 0.01% by mass to 3% by mass, the crosslinking reaction may be properly inhibited and the adhesion between a transparent substrate and the sealing material sheet can be improved.

[Other Components]

The sealing material sheet for a solar-cell module may also include other components. Examples thereof may include the components, such as, a weathering master batch for imparting weatherability to the sealing material sheet prepared from the sealing material sheet of the present invention, various fillers, a light stabilizer, an ultraviolet ray absorbent, and a heat stabilizer. The contents of them are preferably in the range of 0.001% by mass to 5% by mass in the respective sealing material sheet, but vary according to the shapes and densities of their particles. By including such additives, the stable mechanical strength, effect on preventing yellowing or cracks, and the like for a long period of time can be imparted to the sealing material sheet.

The weathering master batch is prepared by dispersing a light stabilizer, an ultraviolet ray absorbent, a heat stabilizer, and the above antioxidant in a resin such as polyethylene. By adding the weathering master batch to the sealing material sheet, favorable weatherability may be imparted to the sealing material sheet. The weathering master batch may be properly prepared and then used, or an article on the market may be used. The resin used in the weathering master batch may be linear low-density polyethylene used in the present invention, or other resins described above may be used.

In addition, such a light stabilizer, an ultraviolet ray absorbent, a heat stabilizer, and an antioxidant may be used respectively, or may be used in a combination of two or more of them.

In addition, besides those described above, other components used for the sealing material sheet of the present invention may be an adhesive improver, a nuclear agent, a dispersant, a leveling agent, a plasticizer, an antifoaming agent, a flame retardant, and the like.

Sealing Material Sheet

A sheet is formed from the sealing material sheet by a molding method that is generally used for a general thermoplastic resin, that is, various molding methods, such as an injection molding method, an extrusion molding method, a hollow molding method, a compression molding method, and a rotary molding method. The molding temperature is preferably the melting point of the polyethylene-based resin+50° C., or more. In detail, it is preferably a high temperature, 150° C. to 250° C., and more preferably in the range of from 190° C. to 230° C.

The sealing material sheet of the present invention may be prepared in the shape of a mono-layer sheet from the sealing material sheet of the present invention by the above preparing method. Both sides of the sealing material sheet in such a mono-layer have high adhesion to glass, a metal, and PET. Therefore, it is preferable with respect to that it is possible to correspond to various layer constitutions, flexibly.

In addition, the sealing material sheet of the present invention may be prepared in the shape of a co-extruded multi-layer sheet by using the sealing material sheet of the present invention as the composition for forming an adhesion-reinforcing layer. The sealing material sheet in the above-described co-extruded multi-layers may be prepared by constituting the sealing material sheet (film) in two layers, in which one layer may be a core layer and the other layer may be an adhesion-reinforcing layer or in three layers or more, in which the adhesion-reinforcing layers may be arranged at least one of outermost layers with a core layer between them. In addition, it may be prepared by constituting three layers or more, in which the adhesion-reinforcing layers may be arranged at both of the outmost layers, respectively.

For the sealing material sheet in the co-extruded multi-layers, the components included in the core layer are not particularly limited. Even in the case where the content of GMA (% by mass) in the whole of the sealing material sheet in the co-extruded multi-layers is out of the above-described predetermined range of the present invention, when the content of GMA (% by mass) of the film constituting an adhesion-reinforcing layer is in the above-described predetermined range, the sealing material sheet in the co-extruded multi-layers is obviously in the range of the present invention.

The contents of the respective components in the whole sealing material sheet according to the co-extruded multi-layer constitution may be flexibly adjusted, and thus, because of this, it is possible to promote cost-cutting through the optimization of the ratio of the raw components.

In addition, the concentration of GMA is unevenly distributed near a laminated surface by any kinds of special means and has substantially the same composition as the sealing material sheet in the co-extruded multi-layers, and thus, the sealing material sheet having improved adhesion to a metal is in the range of the present invention regardless of the mono-layer or multi-layer.

The total thickness of the sealing material sheet is preferably 100 μm to 800 μm, regardless of the mono-layer or multi-layer constitution. When it is less than 100 μm, impacts may not be sufficiently alleviated, and when it exceeds 800 μm, it is difficult to obtain the further effect and also light transmittance is decreased to reduce the power generation efficiency. Therefore, they are not preferable.

The MFR of the sealing material sheet is preferably 0.1 g/10 min or more and less than 1.0 g/10 min. With the MFR in the above range, it is possible for the sealing material sheet to have preferred heat resistance. The MFR of the low-density polyethylene, which is used as a base resin of the sealing material sheet, is preferably 0.5 g/10 min to 40 g/10 min, as described above. However, the MFR of the sealing material sheet of the present invention is within the range of the MFR capable of molding using the sealing material sheet, and also the crosslinking is properly carried out to impart sufficient heat resistance to the sealing material sheet of the present invention. In addition, for the sealing material sheet in the co-extruded multi-layer, the MFR is measured in the state of the multi-layer, which is prepared by laminating all of the layers, integrally, and then the measured value is referred to as the MFR value of the corresponding sealing material sheet in the co-extruded multi-layers.

However, it is more preferable that the respective layers of the sealing material sheet in the co-extruded multi-layers have different MFR values. For the sealing material sheet in a solar-cell module, generally, one side adheres to the electrode side of a solar cell element, and then, is used. In this case, the sealing material sheet is required to have high adhesion regardless of the irregularity of the above-described electrode surface. The sealing material sheet of the present invention has preferred transparency, flexibility, and heat resistance even in the case of the sealing material sheet in the mono-layer, but it is more preferable that the above-described molding properties are excellent on the surface adhering to the electrode surface of the solar cell element. The sealing material sheet in the co-extruded multi-layers of the present invention, in which the respective layers have different MFR values, is arranged at the outermost layer on the side that is used by adhering the layer having high MFR to the electrode surface of the solar cell element, and thus, while as the sealing material sheet, the above preferred transparency and heat resistance are maintained, and also the molding properties may be increased on the surface adhering to the solar cell element.

For example, the thickness of the outermost layer is from 30 μm to 120 μm for the sealing material sheet in the co-extruded multi-layers constituted of three or more layers, and also the ratio of the thicknesses of the intermediate layers of all of the layers except the outermost layer and the thickness of the outermost layer is preferably in the range of outermost layer:intermediate layer:outermost layer=1:3:1 to 1:8:1. With the thickness ratio of the respective layers in the above-described range, the preferred heat resistance as the sealing material sheet may be maintained, and also, the preferred molding properties may be obtained on the outermost layer and preparation costs may be reduced.

[Method for Preparing Sealing Material Sheet]

A sheet is formed from the sealing material sheet by a molding method that is generally used for a general thermoplastic resin, that is, various molding methods, such as an injection molding method, an extrusion molding method, a hollow molding method, a compression molding method, and a rotary molding method. However, in order to properly promote a weak crosslinking reaction during the molding, the molding temperature is preferably the melting point of the polyethylene-based resin+50° C., or more. In detail, it is preferably a high temperature, from 150° C. to 250° C., and more preferably in the range of from 190° C. to 230° C.

The sealing material sheet of the present invention, which is subjected to an extremely weak crosslinking treatment in the proper range, in the viewpoint of the physical properties thereof, is characteristic in that low density is maintained, heat resistance is improved, and film formation ability is sufficient. The density of the sealing material sheet of the present invention is not increased to 0.900 g/cm$^3$ or less, which is almost same as the density of the raw material polyethylene-based resin, and the density difference between the resin compositions before and after the melt-molding is within 0.05 g/cm$^3$. Therefore, for the sealing material sheet of the present invention, which is subjected to an extremely weak crosslinking treatment in the proper range, the transparency is maintained. The MFR of the sealing material sheet of the present invention is as described above, and heat resistance thereof is improved up to the preferred range.

(Ionizing Radiation Crosslinking Treatment Process)

The ionizing radiation crosslinking treatment process, in which the sealing material sheet is subjected to a crosslinking treatment by ionizing radiation after preparing the sheet by using the above-described method, is carried out after preparing the sheet and before performing an integration process into a solar-cell module, and thus, the sealing material sheet of the present invention may be more preferably prepared. The ionizing radiation crosslinking treatment process may be carried out in-line subsequently after preparing the sheet, or may be carried out offline.

For the crosslinking treatment by the ionizing radiation irradiation, individual crosslinking conditions are not particularly limited, and may be properly determined so that the gel fraction is in the range of 20% or less, as a result of the whole treatment. The acceleration voltage of the electron beam irradiation is determined according to the thickness of the sheet that is the body to be irradiated, and as the sheet thickness is thick, high acceleration voltage is required. For example, the sheet having the thickness of 0.5 mm is irradiated with 100 kV or more, and preferably 200 kV or more. When the acceleration voltage is less than the above value, the crosslinking is not sufficiently performed. The quantity of radiation is in the range of from 5 kGy to 1000 kGy, and preferably from 5 kGy to 300 kGy. When the quantity of radiation is less than 5 kGy, sufficient crosslinking is not carried out, and when it exceeds 1000 kGy, it is likely to generate the modification of the sheet or coloration of the sheet due to the heat generated. In addition, the sides of both surfaces may be irradiated. In addition, the irradiation may be performed in an air atmosphere or nitrogen atmosphere.

The sealing material sheet while being subjected to the ionizing radiation crosslinking treatment process becomes the sealing material sheet crosslinked by the irradiation of ionizing radiation. With the sealing material sheet being subjected to such crosslinking, while sufficient metal adhesion for the sealing material sheet of the present invention is maintained, the heat resistance may be even more excellent.

In addition, the gel fraction of the sealing material sheet that is crosslinked by the irradiation of ionizing radiation is preferably 20% or less, and more preferably 5% or less. When the gel fraction exceeds 20%, the irregularities are not sufficiently filled during the modularization process, and thus, it is difficult to use. When the gel fraction is in the above-described range, while the excessive flowing is inhibited, and the sealing properties to the irregularities may be favorably maintained.

Here, 0.1 g of the sealing material sheet is added to a resin mesh, the sealing material sheet in the resin mesh is extracted with toluene of 60° C. for 4 hours, the sealing material sheet is taken out from the resin mesh, the sealing material sheet is dried, the weight of the dried sealing material sheet is measured, the masses before and after extracting are compared, and then the mass % of the residue insoluble matter is measured. The mass % of the residue insoluble matter is referred to as the gel fraction (%) in the present specification.

Solar-Cell Module

For the solar-cell module 1 of the present invention, the sealing material sheet in the mono-layer of the present invention or the sealing material sheet in the co-extruded multi-layers of the present invention (hereinafter, both of them are also referred to as "the sealing material sheet of the present invention") is used on at least one side of the front sealer layer 3 and back-surface sealer layer 5, which are the sealer layers.

The solar-cell module, which is prepared by using the sealing material sheet of the present invention on any of the sealer layers, is in the range of the present invention. However, the solar-cell module, which is prepared by using the sealing material sheet of the present invention on both the front sealer layer 3 and the back-surface sealer layer 5, has increased adhesion between the whole members constituted of glass, a metal, and the like, and thus, may be particularly preferably used.

In addition, the transparent front substrate 2, the solar cell element 4, and the rear-surface protecting sheet 6 in the solar-cell module 1 of the present invention may use the conventionally known raw materials without limit. In addition, the solar-cell module 1 of the present invention may include members other than the above-described members. In addition, the sealing material sheet of the present invention may be preferably used for all of the solar-cell modules in a single-crystal type, a thin-film type and other types.

In addition, the layer constitution of the solar-cell module of the present invention is not limited to the layer constitutions according to the embodiments described above. The sealing material sheet of the present invention has adhesion to all glasses and metals, and thus, may be widely used for the solar-cell modules having various constitutions including glass materials and metallic solar-cell modules by using the above properties. For example, for the constitution in which one side of the sealing material sheet in the solar-cell module is facing all of glasses and metals, the sealing material sheet of the present invention may be properly used.

[Method for Preparing Solar-Cell Module]

The solar-cell module 1 can be prepared, for example, by laminating the members constituted of the transparent front substrate 2, the front sealer layer 3, the solar cell element 4, the back-surface sealer layer 5, and the rear-surface protecting sheet 6 in order, integrating the laminated members by a vacuum aspiration or the like, and then, thermocompression-molding the above members in one molding body by a molding method such as a laminating method. During such thermocompression-molding, it is considered that a glycidyl group of the GMA in the sealing material sheet is opened, and then, bound to the substrate to be adhered, and thereby the adhesion between the sealing material sheet and other constituting members is increased.

Examples

Hereinafter, the present invention will be described in more detail with reference to Examples, but the present invention is not limited to the following Examples.
Preparation of Sealing Material Sheet
(Mono-Layered Sheet)

The sealing material sheets having the compositions listed in the following Table 1 were mixed to prepare a blend for a mono-layer. Using the above blend, the mono-layered sealing material sheet for a solar-cell module having a total thickness of 400 μm was prepared at an extrusion temperature of 210° C. and a taking-up speed of 1.1 m/min using a film molder having a φ30 mm extruder and a T dice having a width of 200 mm (Examples 1 to 3 and Comparative Examples 1 to 3).
(Co-Extruded Multi-Layered Sheet)

In addition, the sealing material sheets having the compositions listed in the following Table 2 were mixed to prepare the blends for an inner layer and outer layer for molding the three-layered sheet in the co-extruded multi-layers. Using the above blends, respectively, the films were molded at an extrusion temperature of 210° C. and a taking-up speed of 1.1 m/min using a film molder having a φ30 mm extruder and a T dice having a width of 200 mm, and then the molded films were laminated to prepare the three-layered sealing material sheet in the co-extruded multi-layers. The total thickness of the sealing material sheet was 400 μm, and the thicknesses ratio of outer layer:inner layer:outer layer was 1:5:1. Example 4 and Comparative Example 4

The following raw materials were used as the raw materials for the sealing material sheet.

Silane modified transparent resin (marked with "Si" in Tables 1 and 2): 2 parts by mass of vinyltrimethoxysilane and 0.1 parts by mass of dicumyl peroxide as a radical generating agent (reaction catalyst) were mixed with respect to 98 parts by mass of metallocene-based linear low-density polyethylene (M-LLDPE) having a density of 0.881 g/cm$^3$ and an MFR of 2 g/10 min at 190° C., and then, melted and kneaded at 200° C. to obtain a silane modified transparent resin having a density of 0.884 g/cm$^3$ and an MFP of 1.8 g/10 min at 190° C.

Weathering master batch (marked "weathering" in Tables 1 and 2): with respect to 100 parts by mass of the powder prepared by grinding a ziegler linear low-density polyethylene having a density of 0.880 g/cm$^3$, 3.8 parts by mass of a benzophenol-based ultraviolet ray absorbent, 5 parts by mass of a hindered amine-based light stabilizer, and 0.5 parts by mass of a phosphorus-based heat stabilizer were mixed, melted, and processed to obtain a pellet master batch.

Polymerization initiator compound resin 1 (marked "polymerization 1" in Tables 1 and 2): with respect to 100 parts by mass of an M-LLDPE pellet having a density of 0.880 g/cm$^3$ and an MFR of 3.1 g/10 min at 190° C., 0.033 parts by mass of 2,5-dimethyl-2,5-di(t-butyl peroxy)hexane (polymerization initiator A) was immersed to obtain the compound pellet.

In addition, the contents (% by mass) of the polymerization initiators (crosslinking agents) in the sealing material sheet are listed in Tables 1 and 2, respectively.

Polymerization initiator compound resin 2 (marked "polymerization 2" in Tables 1 and 2): with respect to 100 parts by mass of an M-LLDPE pellet having a density of 0.880 g/cm$^3$ and an MFR of 3.1 g/10 min at 190° C., 0.066 parts by mass of 2,5-dimethyl-2,5-di(t-butyl peroxy)hexane (polymerization initiator A) was immersed to obtain the compound pellet. In addition, the contents (% by mass) of the crosslinking agents in the sealing material sheet are listed in Tables 1 and 2, respectively.

Polymerization initiator compound resin 3 (marked "polymerization 3" in Tables 1 and 2): with respect to 100 parts by mass of an M-LLDPE pellet having a density of 0.880 g/cm$^3$ and an MFR of 3.1 g/10 min at 190° C., 0.33 parts by mass of t-amylperoxy-2-ethylhexyl carbonate (polymerization initiator B) was immersed to obtain the compound pellet. In addition, the contents (% by mass) of the crosslinking agents in the sealing material sheet are listed in Tables 1 and 2, respectively.

Polymerization initiator compound resin 4 (marked "polymerization 4" in Tables 1 and 2): with respect to 100 parts by mass of an M-LLDPE pellet having a density of 0.880 g/cm$^3$ and an MFR of 3.1 g/10 min at 190° C., 0.66 parts by mass of 2,5-dimethyl-2,5-di(t-butyl peroxy)hexane (polymerization initiator A) was immersed to obtain the compound pellet. In addition, the contents (% by mass) of the crosslinking agents in the sealing material sheet are listed in Tables 1 and 2, respectively.

Polymerization initiator compound resin 5 (marked "polymerization 5" in Tables 1 and 2): with respect to 100 parts by mass of an M-LLDPE pellet having a density of 0.880 g/cm$^3$ and an MFR of 3.5 g/10 min at 190° C., 0.041 parts by mass of 2,5-dimethyl-2,5-di(t-butyl peroxy)hexane (polymerization initiator A) was immersed to obtain the compound pellet.

M-LLDPE (marked with "ML" in Tables 1 and 2): metallocene-based linear low-density polyethylene having a density of 0.901 g/cm$^3$ and an MFR of 2.0 q/10 min at 190° C.

GMA (marked "GMA" in Tables 1 and 2): the added amount of glycidyl methacrylate (GMA) (Product Name, Glycidyl methacrylate, manufactured by Mitsubishi Gas Chemical Company, Inc.) was adjusted so that the content (% by mass) in the sealing material sheet was to be the content listed in Tables 1 and 2.

TAIC (marked with "TAIC" in Tables 1 and 2): the added amount of triallyl isocyanurate (TAIC) (Product Name, SR533, manufactured by Statomer) was adjusted so that the content (% by mass) in the sealing material sheet was to be the content listed in Tables 1 and 2.

The sealing material sheets of Examples 1 and 3 prepared as described above were subjected to an EB crosslinking treatment under the following crosslinking conditions to obtain the EB-crosslinked sealing material sheets. Then, the EB-crosslinked sealing material sheets were referred to as the sealing material sheets of Examples 2 and 4.
(Crosslinking Treatment by Ionizing Radiation Irradiation)

The crosslinking treatments on both surfaces of the sealing material sheets of Examples 1 and 3 were performed with the irradiation strength of the ionizing radiation being 15 kGy and the acceleration voltage being 200 kV.

TABLE 1

| (Part by mass) | Si | Weathering | Polymerization 1 | Polymerization 2 | Polymerization 3 | Polymerization 4 | Content of GMA (% by mass) | Content of TAIC (% by mass) | Content of crosslinking agent (% by mass) | EB crosslinking |
|---|---|---|---|---|---|---|---|---|---|---|
| Example 1 | 20 | 5 | 80 | | | | 0.45 | 0.3 | 0.025 | No |
| Example 2 | 20 | 5 | 80 | | | | 0.45 | 0.3 | 0.025 | Yes |
| Comparative Example 1 | 20 | 5 | | 80 | | | 0 | 0 | 0.05 | No |
| Comparative Example 2 | 20 | 5 | | 80 | | | 0 | 0.3 | 0.05 | No |
| Comparative Example 3 | 20 | 5 | | | 80 | | 0.45 | 0 | 0.25 | No |
| Comparative Example 4 | 20 | 5 | | | | 80 | 0.45 | 0 | 0.5 | No |

TABLE 2

| (Part by mass) | | Si | Weathering | Polymerization 1 | Polymerization 5 | Content of GMA (% by mass) | Content of TAIC (% by mass) | Content of crosslinking agent (% by mass) | EB crosslinking |
|---|---|---|---|---|---|---|---|---|---|
| Example 3 | Inner layer | 3 | 5 | | 97 | 0 | 0 | 0.038 | No |
| | Outer layer | 20 | 5 | 80 | | 0.45 | 0.3 | 0.025 | |
| Example 4 | Inner layer | 3 | 5 | | 97 | 0 | 0 | 0.038 | Yes |
| | Outer layer | 20 | 5 | 80 | | 0.45 | 0.3 | 0.025 | |

Adhesion Evaluation

The sealing material sheets of Examples 1 to 4 and Comparative Examples 1 to 4 which were cut to a width of 15 mm were adhered onto the zinc oxide plates (75 mm×50 mm×0.1 mm) and a vacuum heating lamination treatment was carried out according to the following heat lamination conditions (a) to (d) to obtain the samples for evaluating the adhesion of the solar-cell module for each of Examples and Comparative Examples. The metal adhesions for the samples for evaluating the adhesion of the solar-cell modules were evaluated by measuring the adhesion strength under the following test conditions. The results thus obtained are listed in Table 3.

[Heat Lamination Condition]
(a) Vacuum evacuation: 5.0 minutes
(b) Pressurization (0 kPa to 100 kPa): 1.5 minutes
(c) Pressure maintenance (100 kPa): 8.0 minutes
(d) Temperature 150° C.

[Test Method of Metal Adhesion Strength (N/15 mm)]

The sealing material sheets adhered to the zinc oxide plates for the samples for evaluating the adhesion of the solar-cell modules were subjected to a vertical peeling-off (50 mm/min) test with a peeling-off tester (RTF-1150-H, Tensilon universal tester) to measure the metal adhesion strength. In the present test, if the adhesion strength was 10 N/15 mm or more, it was evaluated as the sealing material sheet having the preferred metal adhesion.

Heat Resistance Evaluation

Two sealing material sheets of Examples and Comparative Examples, which were cut to the size of 75 mm×50 mm, and one semi-tempered glass of 75 mm×50 mm were laminated in order onto a 250 mm square piece of semi-tempered glass, and then, according to the same conditions as the heat lamination conditions (a) to (d), the vacuum heating lamination treatment was carried out thereon to obtain the samples for evaluating the heat resistance of the solar-cell modules for the respective Examples and Comparative Examples. For the samples for evaluating the heat resistance of the solar-cell modules, the heat resistance strength was measured under the following test conditions to evaluate the heat resistance. The results thus obtained are listed in Table 3.

[Heat Resistance Strength Test Method]

With the samples for evaluating the heat resistance for the solar-cell modules being in a state of leaning at 45 degrees, the samples were allowed to stand for 12 hours in an oven at 120° C., and then the dislocated distance of the semi-tempered glass was measured and then heat resistance was evaluated. In the present test, if the adhesion strength of the dislocated distance of the glass is 10 mm or less, it was evaluated as the sealing material sheet having favorable heat resistance.

TABLE 3

| | Adhesion (N/15 mm) | Heat resistance (mm) |
|---|---|---|
| Example 1 | 22.8 | 5.5 |
| Example 2 | 20.4 | 3.1 |
| Example 3 | 23.5 | 4.5 |
| Example 4 | 21.7 | 3.2 |
| Comparative Example 1 | 2.5 | 4.5 |
| Comparative Example 2 | 7.2 | 2.5 |
| Comparative Example 3 | 23.6 | 15.7 |
| Comparative Example 4 | 17.0 | 10.3 |

In addition, for film formation ability, Examples and Comparative Examples could be normally molded. Meanwhile, Comparative Example 5 was prepared in the same method as Example 1, except that the content of the polymerization initiator in the sealing material sheet was to be 0.5% by mass. However, for Comparative Example 5, the MFR was increased, and gel was generated, and thereby it was not possible to form a film.

As listed in Tables 1 to 3, it can be confirmed that the sealing material sheets of Examples 1 to 4 have excellent heat resistance and also sufficient preferred adhesion to a metal (zinc oxide), and thus, are preferable as the sealing material sheet constituting a solar-cell module. In addition, from the test results of Comparative Example 4, it can be confirmed that the problem of there being insufficient improvement in heat resistance from the crosslinking treatment when GMA is added cannot be solved when the amount of crosslinking agent is simply increased, and the problem can only be solved by the composition of the invention of the present application, in which all the added amounts of GMA, TAIC, and a crosslinking agent are optimized.

The invention claimed is:

1. A sealing material sheet for a solar-cell module, the sealing material sheet comprising:
    a polyethylene-based resin with a density of 0.900 g/cm$^3$ or less;
    glycidyl methacrylate;
    a radical polymerization initiator; and
    triallyl isocyanurate,
    wherein the content of the glycidyl methacrylate in the sealing material sheet is 0.15% by mass to 3.0% by mass,
    the content of the triallyl isocyanurate in the sealing material sheet is 0.15% by mass to 3.0% by mass, and
    the content of the radical polymerization initiator in the sealing material sheet is 0.01% by mass to 2.5% by mass.

2. The sealing material sheet for a solar-cell module according to claim 1, wherein the content of the radical polymerization initiator in the sealing material sheet is 0.01% by mass to 0.5% by mass.

3. The sealing material sheet for a solar-cell module according to claim 1, wherein the polyethylene-based resin is metallocene-based linear low-density polyethylene.

4. The sealing material sheet for a solar-cell module according to claim 1, wherein the polyethylene-based resin includes a silane copolymer constituted by copolymerizing at least α-olefin and an ethylenically unsaturated silane compound in a comonomer.

5. A sealing material sheet for a solar-cell module, the sealing material sheet being a sealing material sheet for a solar-cell module in a mono-layer or co-extruded multi-layers including an adhesion-reinforcing layer,
    wherein the adhesion-reinforcing layer is constituted of the sealing material sheet according to claim 1,
    when the sealing material sheet is in the mono-layer, the sealing material sheet in the mono-layer is constituted of the adhesion-reinforcing layer, and
    when the sealing material sheet is in the co-extruded multi-layers, the adhesion-reinforcing layer is arranged on the outermost layer of at least any one side.

6. A method for preparing a sealing material sheet for a solar-cell module, the method comprising a process for melting and molding the sealing material sheet according to claim 1,
    wherein the glycidyl methacrylate is mixed with the polyethylene-based resin in a state of a simple substance being isolated from other components, and thus, the sealing material sheet is adjusted.

7. A method for preparing a sealing material sheet for a solar-cell module, the method comprising an ionizing radiation crosslinking treatment process for obtaining a sealing material sheet after being crosslinked by irradiating the ionizing radiation by performing the further crosslinking treatment through the irradiation of an ionizing radiation to the sealing material sheet according to claim 5.

8. A solar-cell module comprising the sealing material sheet according to claim 5; and
    a solar cell element having metal electrodes,
    wherein the sealing material sheet and the solar cell element are adhered and laminated.

9. The sealing material sheet for a solar-cell module according to claim 2, wherein the polyethylene-based resin is metallocene-based linear low-density polyethylene.

10. The sealing material sheet for a solar-cell module according to claim 2, wherein the polyethylene-based resin includes a silane copolymer constituted by copolymerizing at least α-olefin and an ethylenically unsaturated silane compound in a comonomer.

11. The sealing material sheet for a solar-cell module according to claim 3, wherein the polyethylene-based resin includes a silane copolymer constituted by copolymerizing at least α-olefin and an ethylenically unsaturated silane compound in a comonomer.

12. A sealing material sheet for a solar-cell module, the sealing material sheet being a sealing material sheet for a solar-cell module in a mono-layer or co-extruded multi-layers including an adhesion-reinforcing layer,
    wherein the adhesion-reinforcing layer is constituted of the sealing material sheet according to claim 2,
    when the sealing material sheet is in the mono-layer, the sealing material sheet in the mono-layer is constituted of the adhesion-reinforcing layer, and
    when the sealing material sheet is in the co-extruded multi-layers, the adhesion-reinforcing layer is arranged on the outermost layer of at least any one side.

13. A sealing material sheet for a solar-cell module, the sealing material sheet being a sealing material sheet for a solar-cell module in a mono-layer or co-extruded multi-layers including an adhesion-reinforcing layer,
    wherein the adhesion-reinforcing layer is constituted of the sealing material sheet according to claim 3,
    when the sealing material sheet is in the mono-layer, the sealing material sheet in the mono-layer is constituted of the adhesion-reinforcing layer, and
    when the sealing material sheet is in the co-extruded multi-layers, the adhesion-reinforcing layer is arranged on the outermost layer of at least any one side.

14. A sealing material sheet for a solar-cell module, the sealing material sheet being a sealing material sheet for a solar-cell module in a mono-layer or co-extruded multi-layers including an adhesion-reinforcing layer,
    wherein the adhesion-reinforcing layer is constituted of the sealing material sheet according to claim 4,
    when the sealing material sheet is in the mono-layer, the sealing material sheet in the mono-layer is constituted of the adhesion-reinforcing layer, and
    when the sealing material sheet is in the co-extruded multi-layers, the adhesion-reinforcing layer is arranged on the outermost layer of at least any one side.

15. A method for preparing a sealing material sheet for a solar-cell module, the method comprising a process for melting and molding the sealing material sheet according to claim 2,
    wherein the glycidyl methacrylate is mixed with the polyethylene-based resin in a state of a simple substance being isolated from other components, and thus, the sealing material sheet is adjusted.

16. A method for preparing a sealing material sheet for a solar-cell module, the method comprising a process for melting and molding the sealing material sheet according to claim 3,
   wherein the glycidyl methacrylate is mixed with the polyethylene-based resin in a state of a simple substance being isolated from other components, and thus, the sealing material sheet is adjusted.

17. A method for preparing a sealing material sheet for a solar-cell module, the method comprising a process for melting and molding the sealing material sheet according to claim 4,
   wherein the glycidyl methacrylate is mixed with the polyethylene-based resin in a state of a simple substance being isolated from other components, and thus, the sealing material sheet is adjusted.

* * * * *